(12) United States Patent
Nakajima et al.

(10) Patent No.: US 9,755,180 B2
(45) Date of Patent: Sep. 5, 2017

(54) LIGHT EMITTING DEVICE

(71) Applicants: PIONEER CORPORATION, Kawasaki-shi, Kanagawa (JP); TOHOKU PIONEER CORPORATION, Tendo-shi, Yamagata (JP)

(72) Inventors: Shinji Nakajima, Yonezawa (JP); Koji Fujita, Yonezawa (JP); Miho Sugimoto, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 16 days.

(21) Appl. No.: 14/781,559

(22) PCT Filed: Apr. 1, 2013

(86) PCT No.: PCT/JP2013/059836
§ 371 (c)(1),
(2) Date: Sep. 30, 2015

(87) PCT Pub. No.: WO2014/162395
PCT Pub. Date: Oct. 9, 2014

(65) Prior Publication Data
US 2016/0072095 A1    Mar. 10, 2016

(51) Int. Cl.
*H01L 51/52* (2006.01)
*H01L 27/32* (2006.01)

(52) U.S. Cl.
CPC ...... *H01L 51/5246* (2013.01); *H01L 51/5253* (2013.01); *H01L 27/3246* (2013.01); *H01L 27/3276* (2013.01); *H01L 2251/558* (2013.01)

(58) Field of Classification Search
CPC ............ H01L 51/5253; H01L 51/5246; H01L 27/3276; H01L 27/3246; H01L 2251/558
See application file for complete search history.

(56) References Cited

U.S. PATENT DOCUMENTS 8,263,175 B2    9/2012    Ishida et al.
2005/0112874 A1    5/2005    Skarp et al.
(Continued)

FOREIGN PATENT DOCUMENTS

JP    2003-347042    12/2003
JP    2006-165537 A    6/2006
(Continued)

OTHER PUBLICATIONS

International Search Report for PCT/JP2013/059836, dated Jun. 18, 2013.
(Continued)

*Primary Examiner* — Roy Potter
(74) *Attorney, Agent, or Firm* — Procopio, Cory, Hargreaves & Savitch LLP (57) ABSTRACT

A light emitting device (10) includes a substrate (100), an organic EL element (102), a buffer film (210), and a sealing film (220). The organic EL element (102) is formed over the substrate (100). The sealing film (220) is located over the substrate (100) and over the organic EL element (102), and seals the organic EL element (102). In addition, the buffer film (210) is located between the organic EL element (102) and the sealing film (220), and comes into close contact with the sealing film (220). The sealing film (220) includes at least one layer formed of, for example, an oxide.

5 Claims, 11 Drawing Sheets

(56) References Cited

U.S. PATENT DOCUMENTS

| | | | |
|---|---|---|---|
| 2006/0017383 A1 | 1/2006 | Ishida et al. | |
| 2006/0061272 A1* | 3/2006 | McCormick | H01L 51/5253 |
| | | | 313/512 |
| 2007/0020451 A1* | 1/2007 | Padiyath | H01L 51/5256 |
| | | | 428/336 |
| 2009/0191781 A1 | 7/2009 | Ishida et al. | |
| 2010/0108524 A1* | 5/2010 | van Mol | C25D 5/10 |
| | | | 205/50 |
| 2011/0300770 A1* | 12/2011 | Fukuda | B32B 15/08 |
| | | | 445/58 |
| 2012/0050145 A1 | 3/2012 | Yasumatsu | |
| 2016/0072095 A1* | 3/2016 | Nakajima | H01L 51/5253 |
| | | | 257/40 |

FOREIGN PATENT DOCUMENTS

| | | |
|---|---|---|
| JP | 2006-253106 A | 9/2006 |
| JP | 2007-200692 | 8/2007 |
| JP | 2008-010211 | 1/2008 |
| JP | 2008-171752 A | 7/2008 |
| JP | 2008-251292 | 10/2008 |
| JP | 2010-049986 | 3/2010 |
| JP | 2010-118291 A | 5/2010 |
| JP | 2010-231977 | 10/2010 |
| JP | 2012-064421 | 3/2012 |
| WO | 2010-125622 | 11/2010 |

OTHER PUBLICATIONS

Office Action for Corresponding JP App No. 2015-509633 dated Jan. 10, 2017, 5 pgs.

* cited by examiner

LIGHT EMITTING DEVICE

TECHNICAL FIELD

The present invention relates to a LIGHT EMITTING device.

BACKGROUND ART

One of the light sources for illumination devices and displays is an organic electroluminescence (EL) element. The organic EL element is vulnerable to moisture, and thus is required to be sealed. For example, as disclosed in Patent Document 1, a sealing film may be used as a sealing structure of the organic EL element. In Patent Document 1, alumina formed by an atomic layer deposition method is used as the sealing film.

RELATED DOCUMENT

Patent Document

[Patent Document 1] Japanese Laid-open Patent Publication No. 2003-347042

SUMMARY OF THE INVENTION

Technical Problem

Even when a sealing film is provided on an organic EL element, an inferior adhesiveness of the sealing film and the organic EL element may result in the occurrence of peeling at an interface between the sealing film and the organic EL element or the occurrence of cracking in the sealing film. For this reason, the sealing effect of the sealing film is lowered.

A problem that the present invention is to solve includes an example in which adhesiveness of an organic EL element and a sealing film is increased.

Solution to Problem

The invention according to claim 1 is a light emitting device including a substrate, an organic EL element which is formed over the substrate, a sealing film which is formed over the organic EL element, and a buffer film which is located between the organic EL element and the sealing film. The buffer film comes into close contact with the sealing film.

BRIEF DESCRIPTION OF THE DRAWINGS

The above-described objects, other objects, features and advantages will becomes further apparent from the preferred embodiments described below, and the accompanying drawings as follows.

DESCRIPTION OF EMBODIMENTS

Hereinafter, embodiments of the invention will be described with reference to the accompanying drawings. In all the drawings, like reference numerals denote like components, and a description thereof will not be repeated.

In the following description, it is assumed that the concept "close contact" includes adhesion and cohesion. In addition, high adhesive force between two films indicates that peeling is not likely to occur at an interface between the two films.

Figure 1:
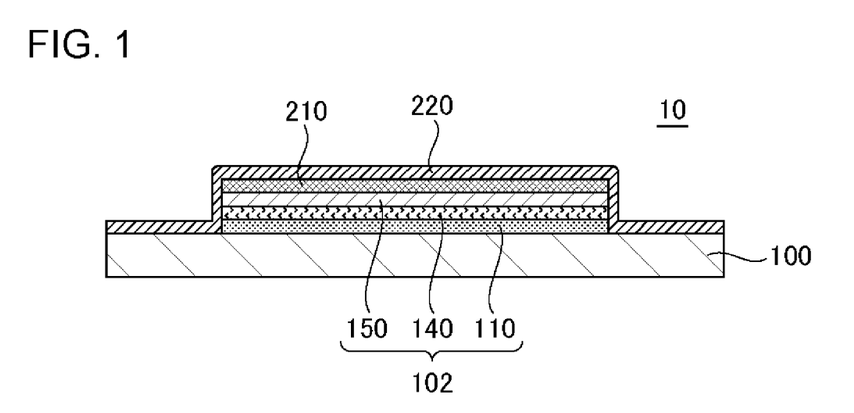
FIG. 1 is a cross-sectional view illustrating a configuration of a light emitting device according to an embodiment.

FIG. 1 is a cross-sectional view illustrating a configuration of a light emitting device 10 according to an embodiment. The light emitting device 10 according to the embodiment includes a substrate 100, an organic EL element 102, a buffer film 210, and a sealing film 220. The organic EL element 102 is formed on the substrate 100. The sealing film 220 is located over the substrate 100 and over the organic EL element 102, and seals the organic EL element 102. The buffer film 210 is located between the organic EL element 102 and the sealing film 220, and comes into close contact with the sealing film 220. The sealing film 220 includes at least one layer formed of, for example, an oxide. A film thickness of the buffer film 210 is, for example, equal to or greater than approximately 10 nm and equal to or less than approximately 300 nm, but is not limited thereto.

In the present embodiment, the organic EL element 102 is configured such that a first electrode 110, an organic layer 140, and a second electrode 150 (upper electrode) are laminated in this order. In addition, the buffer film 210 comes into contact with the second electrode 150. It is preferable that the buffer film 210 also comes into close contact with the second electrode 150. Meanwhile, adhesive force between the buffer film 210 and the sealing film 220 may be higher than adhesive force between the buffer film 210 and the second electrode 150. In addition, adhesive force between the buffer film 210 and the sealing film 220 is higher than adhesive force between the sealing film 220 and the second electrode 150 in a case where the sealing film 220 is formed so as to come into contact with the second electrode 150. Meanwhile, the magnitude of the adhesive force can be measured by performing, for example, a peel test. Meanwhile, details of the peel test are specified in, for example, JISZ0237 and JISD0202-1988.

For example, when the second electrode 150 is formed of a metal such as Al and the sealing film 220 includes a layer formed of an oxide, for example, a metal oxide such as an aluminum oxide, a portion of the buffer film 210 which comes into contact with at least the sealing film 220 is formed of an organic film, for example, tris(8-hydroxyquinolinato)aluminium (Alq3).

In addition, adhesive force between the buffer film 210 and the sealing film 220 is also increased, for example, by providing irregularities in the surface of the buffer film 210. Similarly, adhesive force between the second electrode 150 and the buffer film 210 is also increased, for example, by providing irregularities in the surface of the second electrode 150. Such irregularities are formed, for example, by performing a film formation method using a mask, for example, performing sputtering on the layers. In addition, such irregularities are formed by divisionally performing film formation, at least one time of which is performed using a mask.

As described above, according to the present embodiment, the buffer film 210 is provided between the organic EL element 102 and the sealing film 220. In addition, the sealing film 220 comes into close contact with the buffer film 210. Accordingly, even when the sealing film 220 which is likely to be deformed is provided, it is possible to make the organic EL element 102 emit light.

In addition, adhesive force between the buffer film 210 and the sealing film 220 is higher than adhesive force between the sealing film 220 and the second electrode 150 in a case where the sealing film 220 is formed so as to come into contact with the second electrode 150. Accordingly, adhesiveness of the sealing film 220 and the organic EL element 102 is increased by providing the buffer film 210.

In addition, adhesive force between the buffer film 210 and the sealing film 220 is higher than adhesive force between the buffer film 210 and the second electrode 150. Accordingly, even when the sealing film 220 which is likely to be deformed is provided, it is possible to make the organic EL element 102 emit light.

EXAMPLES

Example 1

Figure 2:
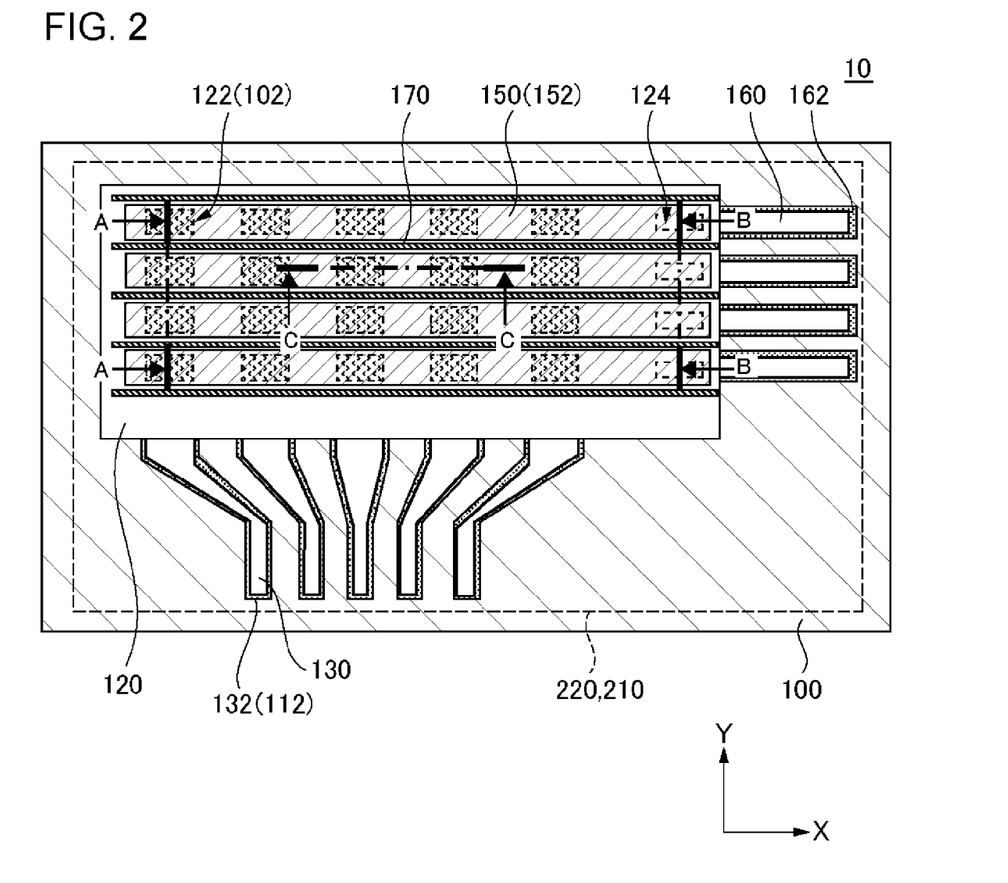
FIG. 2 is a plan view illustrating a configuration of a light emitting device according to Example 1.
Figure 3:
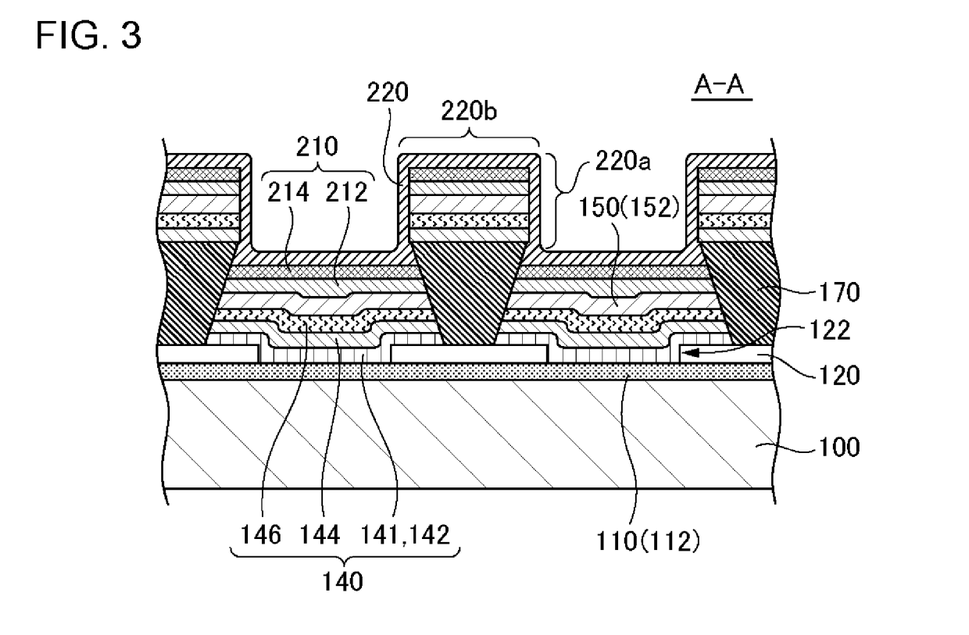
FIG. 3 is a cross-sectional view taken along line A-A of FIG. 2.
Figure 4:
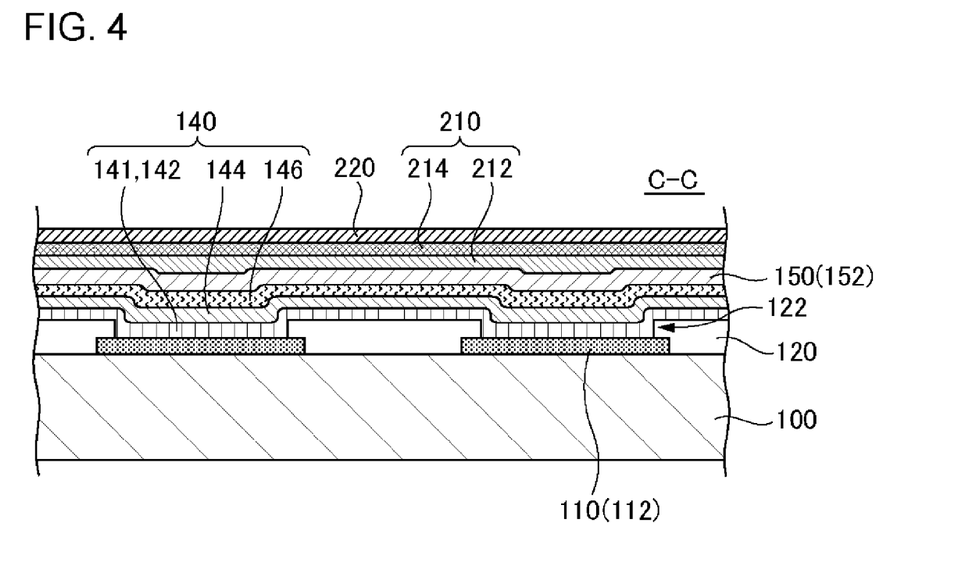
FIG. 4 is a cross-sectional view taken along line C-C of FIG. 2.
Figure 5:
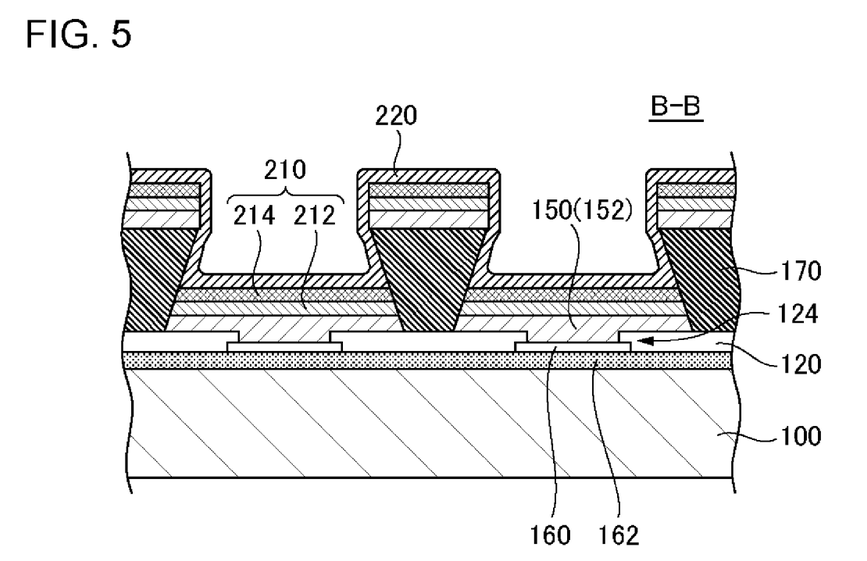
FIG. 5 is a cross-sectional view taken along line B-B of FIG. 2.

FIG. 2 is a plan view illustrating a configuration of a light emitting device 10 according to Example 1. FIG. 3 is a cross-sectional view taken along line A-A of FIG. 2, FIG. 4 is a cross-sectional view taken along line C-C of FIG. 2, and FIG. 5 is a cross-sectional view taken along line B-B of FIG. 2.

The light emitting device 10 is, for example, a display or an illumination device. When the light emitting device 10 is an illumination device, the light emitting device 10 may realize color rendering properties by including the first electrode 110, the organic layer 140, and the second electrode 150. The light emitting device 10 as the illumination device may be configured such that the first electrode 110, the organic layer 140, and the second electrode 150 are formed on one surface thereof, without forming a partition wall 170 as a structure to be described later. Meanwhile, in the following description, a case where the light emitting device 10 is a display is illustrated.

The light emitting device 10 includes a substrate 100, the first electrode 110 (lower electrode), the organic EL element 102, an insulating layer 120, a plurality of first openings 122, a plurality of second openings 124, a plurality of lead-out wirings 130, the organic layer 140, a second electrode 150 (upper electrode), a plurality of lead-out wirings 160, and a plurality of the partition walls 170. The insulating layer 120 and the partition walls 170 are examples of structures formed over the substrate. In addition, the organic EL element 102 is constituted by a laminate in which the organic layer 140 is interposed between the first electrode 110 and the second electrode 150. The organic EL element 102 is located between the plurality of partition walls 170. That is, the organic EL element 102 and the lead-out wirings 160 are located on a first face side of the substrate 100.

The substrate 100 is formed of, for example, glass or a resin material, but may be formed of another material.

The first electrode 110 is formed on the first face of the substrate 100, and linearly extends in a first direction (Y direction in FIG. 2) as illustrated in FIG. 5 to be described later. The first electrode 110 is a transparent electrode formed of, for example, an inorganic material such as indium tin oxide (ITO) or indium zinc oxide (IZO) or a conductive polymer such as a polythiophene derivative. In addition, the first electrode 110 is formed as a portion of a first conductor 112. The first electrode 110 may be a thin metal film to the extent that light passes therethrough. In addition, an end of the first conductor 112 is connected to the lead-out wirings 130. In the example illustrated in the drawing, a structure in which the lead-out wirings 130 are laminated on the end of the first conductor 112 is shown.

Each of the lead-out wirings 130 is a wiring for connecting the first electrode 110 and the outside including an electronic component such as a driving IC. The lead-out wiring 130 is a metal wiring formed of a metal material such as, for example, ITO, IZO, Al, Cr, or Ag which is an oxide conductive material, or an alloy thereof, but may be a wiring formed of a conductive material other than a metal. In addition, the lead-out wiring 130 may include a laminated structure in which a plurality of layers are laminated. In this case, one layer of the lead-out wiring is constituted by a first conductor, and the first electrode 110 and one layer of the lead-out wiring 130 may be continuously constituted by a first conductor. In the example illustrated in FIG. 2, lead-out wirings 132 and the lead-out wirings 130 are formed on the substrate 100 in this order. Each of the lead-out wirings 132 is formed of the same type of material as that of the first electrode 110. In the example illustrated in the drawing, the lead-out wirings 130 and 132 are formed to the vicinity of the first opening 122 which is closest to the lead-out wiring 130. In the example illustrated in the drawing, the first electrode 110 is covered with the insulating layer 120, but at least a portion of the lead-out wirings 130 and the lead-out wirings 132 which are electrically connected to the first electrode 110 may be covered with the insulating layer 120.

As illustrated in FIGS. 2 to 5, the insulating layer 120 is formed on the plurality of first electrodes 110 and is disposed in a region between the plurality of first electrodes 110. The insulating layer 120 is a photosensitive resin such as a polyimide-based resin, and is formed in a desired pattern by being exposed to light and developed. For example, a positive photosensitive resin is used as the insulating layer 120. Meanwhile, the insulating layer 120 may be a resin other than a polyimide-based resin, for example, an epoxy-based resin or an acrylic resin.

The plurality of first openings 122 and the plurality of second openings 124 are formed in the insulating layer 120. Each of the first openings 122 is located at an intersection point between the first conductor 112 serving as the first electrode 110 and a second conductor 152 serving as the second electrode 150 when seen in a plan view. Meanwhile, a portion of the second conductor 152 which is located within the first opening 122 serves as the second electrode 150. The plurality of first openings 122 are provided at predetermined intervals. In addition, the plurality of first openings 122 are lined up in a direction in which the first electrode 110 extends. In addition, the plurality of first openings 122 are also lined up in an extension direction of the second conductor 152. For this reason, the plurality of first openings 122 are disposed to constitute a matrix.

The second opening 124 is located at one end of each of a plurality of second conductors 152 when seen in a plan view. In addition, the second openings 124 are disposed along one side of the matrix constituted by the first openings 122. In addition, when seen in a direction along the side (for example, the Y direction in FIG. 2), the second openings 124 are disposed at predetermined intervals in a direction along the first electrode 110. The lead-out wiring 160 or a portion of the lead-out wiring 160 is exposed from the second opening 124.

Meanwhile, the insulating layer 120 having the first openings 122 and the insulating layer 120 having the second openings 124 may be formed of the same material or may be formed of different materials. In addition, the insulating layer 120 having the second openings 124 may be formed on an outer circumferential side of the substrate 100 with respect to the insulating layer 120 having the first openings 122. In addition, the insulating layer 120 having the first openings 122 and the insulating layer 120 having the second openings 124 may be layers which are contiguous to each other, or may be layers separated (segmented) from each other.

The organic layer 140 is formed in a region overlapping the first opening 122. In the example illustrated in FIG. 3, the organic layer 140 is configured such that a hole transport layer 142, a light emitting layer 144, and an electron transport layer 146 are laminated. Meanwhile, a portion of the organic layer indicates, for example, the hole transport layer 142, the light emitting layer 144, the electron transport layer 146, a hole injection layer 141 to be described later, or an electron injection layer. The hole transport layer 142 comes into contact with the first electrode 110, and the electron transport layer 146 comes into contact with the second electrode 150. In this manner, the organic layer 140 is interposed between the first electrode 110 and the second electrode 150 in a portion overlapping the first opening 122 when seen in a plan view. In addition, the organic EL element 102 is formed in the portion.

Meanwhile, the hole injection layer 141 may be formed between the first electrode 110 and the hole transport layer 142, and the electron injection layer may be formed between the second electrode 150 and the electron transport layer 146. In addition, all of the above-mentioned layers are not necessarily required. For example, when recombination of holes and electrons occurs within the electron transport layer 146, the electron transport layer 146 also has a function of the light emitting layer 144, and thus the light emitting layer 144 is not required. In addition, at least one of the first electrode 110, the hole injection layer 141, the hole transport layer 142, the electron transport layer 146, the electron injection layer, and the second conductor 152 serving as the second electrode 150 may be formed by an coating method such as an ink jet method. In addition, an electron injection layer constituted by an inorganic material such as LiF may be provided between the organic layer 140 and the second electrode 150.

Meanwhile, in the examples illustrated in FIGS. 3 and 4, a case where layers constituting the organic layer 140 protrude to the outside of the first opening 122 is shown. In addition, as illustrated in FIG. 4, the layers constituting the organic layer 140 may be or may not be continuously formed between the adjacent first openings 122 in a direction in which the partition wall 170 extends. However, as illustrated in FIG. 5, the organic layer 140 is not formed in the second opening 124.

The organic layer 140 is interposed between the first electrode 110 and the second electrode 150. As illustrated in FIGS. 2 to 5, the second electrode 150 is formed at a higher position than the organic layer 140 and extends in a second direction (X direction in FIG. 2) which is intersect with the first direction. The second electrode 150 is electrically connected to the organic layer 140. For example, the second electrode 150 may be formed on the organic layer 140, or may be formed on a conductive layer formed on the organic layer 140. The second conductor 152 serving as the second electrode 150 is a metal layer formed of a metal material such as, for example, Ag or Al, or is a layer formed of an oxide conductive material such as IZO. The light emitting device 10 includes the plurality of second conductors 152 which are parallel to each other. One of the second conductors 152 is formed in a direction in which the second conductor passes over the plurality of first openings 122. In addition, the second conductor 152 is connected to the lead-out wiring 160. In the example illustrated in the drawing, an end of the second conductor 152 is located at the second opening 124, and thus the second conductor 152 and the lead-out wiring 160 are connected to each other in the second opening 124.

In the example of FIG. 2, a lead-out wiring 162 is formed under the lead-out wiring 160. In the example illustrated in FIG. 2, the width of the lead-out wiring 162 is larger than the width of the lead-out wiring 160. However, the width of the lead-out wiring may be smaller. The lead-out wirings 160 and 162 are formed in a region on the first face side of the substrate 100 in which the first electrode 110 and the lead-out wirings 130 and 132 are not formed. The lead-out wiring 160 may be formed simultaneously with, for example, the lead-out wiring 130, or may be formed in a process different from that of the lead-out wiring 130. Similarly, the lead-out wiring 162 may be formed simultaneously with, for example, the lead-out wiring 132, or may be formed in a process different from that of the lead-out wiring 132.

The lead-out wiring 162 is formed of a material which is the same type as or a different type from the material constituting the first electrode 110. Here, examples of the same type of material include an oxide conductive material such as ITO or IZO having a composition which is the same as or different from that of ITO constituting the first electrode 110 when the first electrode 110 is formed of ITO which is an oxide conductive material. In addition, examples of a different type of material include a metal material such as Al, and the like.

A portion of the lead-out wiring 160 on one end side (light emitting unit side) is covered with the insulating layer 120 and is exposed at the second opening 124. In addition, in the second opening 124, the second conductor 152 is connected to the lead-out wiring 160. In addition, a portion of the lead-out wiring 160 on the other end side (outer circumferential side of the substrate) is led out to the outside of the insulating layer 120. That is, the other end side of the lead-out wiring 160 is exposed from the insulating layer 120. In a portion of the lead-out wiring 160 on the other end side, the lead-out wiring 160 extends in a direction in which the lead-out wiring is substantially orthogonal to the lead-out wiring 130.

Each of the partition walls 170 is formed between the adjacent second conductors 152. The partition wall 170 is parallel to the second conductor 152, that is, extends in the second direction. The base of the partition wall 170 is, for example, insulating layer 120. The partition wall 170 is a photosensitive resin such as, for example, a polyimide-based resin, and is formed in a desired pattern by being exposed to light and developed. The partition wall 170 is formed using, for example, a negative photosensitive resin. Meanwhile, the partition wall 170 may be formed of a resin other than a polyimide-based resin, for example, an epoxy-based resin or an acrylic resin, or an inorganic material such as silicon dioxide.

The partition wall 170 has a cross section having a shape in which a trapezoid is turned upside down (inverted trapezoid shape). That is, the width of the top face of the partition wall 170 is larger than the width of the bottom face of the partition wall 170. For this reason, the partition wall 170 is formed before the formation of the second conductor 152 (second electrode 150), and the second conductor 152 is formed on the whole surface on the first face side of the substrate 100 by a vapor deposition method or a sputtering method, and thus it is possible to collectively form the plurality of second electrodes 150. The second conductor 152 formed on the whole surface is segmented by the partition wall 170, and thus the plurality of second conductors 152 are provided on the organic layer 140. Examples of a location where each of the second conductors 152 is segmented include the upper side of the insulating layer 120 which is the base of the partition wall 170, the lateral side of the partition wall 170, and the like. In addition, the second conductor 152 can be patterned and freely made into a shape such as a stripe shape, a dot shape, an icon shape, or a curved shape by changing the extension direction of the partition wall 170. Meanwhile, at least the second conductor 152 is formed on the partition wall 170.

In addition, when the organic layer 140 is formed of a coating material, the organic layer 140 is formed by coating the coating material to the plurality of first openings 122. When the application material is applied to the plurality of first openings 122, the partition wall 170 may have a function of preventing the application materials applied to the first openings 122 located on both sides of the partition wall 170 from connecting to each other to thereby continuously form an organic layer from the first opening 122 located on one side of the partition wall 170 to the first opening 122 on the other side. In this case, the partition wall 170 is formed before the formation of the organic layer 140.

In the present example, the second electrode 150 (second conductor 152) is configured as a semi-transmissive film by being formed of a light transmissive material or by the film thickness thereof being adjusted. For example, when the second electrode 150 is formed of Al or Ag, the second electrode 150 is formed to have a film thickness of equal to or greater than 10 nm and equal to or less than 50 nm, and thus can be configured as a semi-transmissive film. However, the film thickness of the second electrode 150 is not limited thereto.

The buffer film 210 is formed on the second conductor 152. In the example illustrated in the present drawing, the buffer film 210 includes at least a first layer 212 and a second layer 214. The first layer 212 comes into contact with the second electrode 150, and the second layer 214 comes into contact with the sealing film 220. Adhesive force between the sealing film 220 and the second layer 214 may be higher than adhesive force between the second electrode 150 and the first layer 212. In addition, it is preferable that adhesiveness of the sealing film 220 and the second layer 214 is higher than adhesiveness of the sealing film 220 and the first layer 212 in a case where the first layer 212 comes into contact with the sealing film 220.

The first layer 212 is a film formed of, for example, an organic material such as tris(8-hydroxyquinolinato)aluminium (Alq3), a light transmissive inorganic material in which Cr and $SiO_2$ are mixed together, or a metal material. The first layer 212 has a thickness of, for example, equal to or greater than approximately 10 nm and equal to or less than approximately 200 nm. In particular, it is preferable that the first layer 212 has a thickness of equal to or greater than approximately 20 nm and equal to or less than approximately 100 nm in that sealing properties are improved or in that when foreign substances are present in a layer located under the first layer 212, planarization can be performed by covering the foreign substances. In addition, the first layer 212 is preferably formed to be thicker in terms of planarization. However, the thickness of the first layer 212 is preferably equal to or less than approximately 200 nm in that the first layer 212 formed of an organic material tends to be broken when the first layer is formed to be excessively thick, and is further preferably equal to or less than approximately 100 nm.

When the first layer 212 is formed of an organic material, the first layer 212 may be formed by a coating method (for example, spray coating, dispenser coating, ink jet, or a printing method) or may be formed by a vapor deposition method. The first layer 212 is also formed on the top face of the partition wall 170. That is, the first layer 212 may be formed on the entire surface of a region of the substrate 100 in which at least the organic EL element 102 is disposed in a matrix, when seen in a plan view. In addition, the first layer 212 may be formed continuously over the region. In this case, the first layer 212 is also formed on the lateral side of a laminated film on the partition wall 170.

The second layer 214 is an inorganic film or a metal film such as, for example, Al or Ag, and the film thickness thereof is, for example, equal to or greater than approximately 30 nm and equal to or less than approximately 200 nm. In particular, the film thickness of the second layer 214 is preferably equal to or greater than approximately 40 nm and equal to or less than approximately 100 nm, in that barrier properties can be improved. The second layer 214 is preferably formed thick in that barrier properties can be improved. On the other hand, there is a tendency for hillocks to be generated in the second layer 214, and thus the thickness of the second layer 214 is preferably equal to or less than approximately 200 nm and is further preferably equal to or less than approximately 100 nm. The term "hillocks" used herein refer to a plurality of convexities formed on the surface of the second layer 214 when Al is formed of, for example, the second layer 214. A gap may be formed between the second layer 214 and the first layer 212 due to the convexities. Such hillocks may be generated also in a case where the second layer 214 is formed of any of other metal materials such as Ag, except for a case where the second layer is formed of Al. The second layer 214 is formed by, for example, a vapor deposition method. The second layer 214 is formed on substantially the entire surface of the first layer 212. Meanwhile, when the first layer 212 is also formed on the lateral side of the laminated film of the partition wall 170, the second layer 214 is also formed on the lateral side of the laminated film of the partition wall 170.

In addition, the sealing film 220 is formed on the second layer 214. The sealing film 220 is formed by, for example, an atomic layer deposition (ALD) method. A film formed by the ALD method has high step coverage. The phrase "step coverage" used herein refers to the uniformity of a film thickness in a portion with a step. The phrase "high step coverage" used herein refers to high uniformity of a film thickness also in a portion with a step, and the phrase "low step coverage" refers to low uniformity of a film thickness in a portion with a step. For example, in the example illustrated in FIG. 3, the partition wall 170 is provided over the substrate 100, and thus a step is formed. At this time, the partition wall 170 serves as a base of the sealing film 220. In addition, in the sealing film 220, a difference between a film thickness of a portion (220a) located on the lateral side of the step and a film thickness of a portion (220*b*) located on the top face of the step is small or substantially zero.

The sealing film 220 may include a plurality of layers formed of an oxide. The sealing film 220 is a film in which, for example, at least one layer formed of titanium oxide and at least one layer formed of an aluminum oxide are alternately laminated, and the film thickness thereof is, for example, equal to or greater than 10 nm and equal to or less than 30 nm. As illustrated in FIG. 2, the sealing film 220 covers the insulating layer 120, the lead-out wirings 160, and the lead-out wirings 130. Meanwhile, the sealing film 220 may be formed by a film formation method other than an ALD method, for example, a CVD method.

Meanwhile, the sealing film 220 has relatively high internal stress. After the sealing film 220 having such internal stress is formed, the shape of the sealing film 220 may be changed (for example, contracted) due to the internal stress. In particular, when the second conductor 152 comes into close contact with the sealing film 220 in a case where the sealing film 220 is directly formed on the second conductor 152, stress due to the sealing film 220 is applied to the second conductor 152, and thus the shape of the second conductor 152 is changed. For this reason, the peeling of a film, or the like occurs at an interface between the second electrode 150 and the organic layer 140 or inside the organic layer 140. In the present example, since the buffer film 210 is provided between the second electrode 150 and the sealing film 220, the peeling or the like can be suppressed. In particular, when the buffer film 210 and the sealing film 220 come into close contact with each other, the stress of the sealing film 220 can be absorbed or a change in the shape of the sealing film 220 is suppressed (the buffer film 210 applies a resistance power to the deformation of the sealing film 220), and thus the peeling of the above-mentioned films, or the like, can be suppressed. In particular, when adhesiveness of the buffer film 210 and the second conductor 152 is low, it is possible to prevent the stress of the sealing film 220 from being applied to the second conductor 152. On the other hand, when adhesiveness of the buffer film 210 and the sealing film 220 is low, the stress of the sealing film 220 is not applied to the buffer film 210, and thus it is possible to prevent the stress of the sealing film 220 from being applied to the second conductor 152. In this case, adhesiveness of the buffer film 210 and the second conductor 152 may be high or low.

In addition, when the first layer 212 is formed of an organic film, adhesiveness of the first layer 212 and the sealing film 220 deteriorates. For this reason, cracking occurs due to a significant change in the shape of the sealing film 220, which may result in deterioration of sealing properties. On the other hand, in the present example, the second layer 214 is provided between the first layer 212 and the sealing film 220. When the second layer 214 comes into close contact with the sealing film 220, it is possible to suppress a change in the shape of the sealing film 220 and to suppress deterioration of sealing properties due to the occurrence of cracking or the like in the sealing film 220.

Next, a method of manufacturing the light emitting device 10 will be described. First, a conductive layer serving as the first electrode 110 is formed on the substrate 100, and the conductive layer is selectively removed by etching (for example, dry etching or wet etching) or the like. Thereby, the first electrode 110 and the lead-out wirings 132 and 162 are formed on the substrate 100.

Subsequently, conductive layers serving as the lead-out wirings 130 and 160 are formed on the substrate 100, the first electrode 110, and the lead-out wirings 132 and 162, and the conductive layers are selectively removed by etching (for example, dry etching or wet etching) or the like. Thereby, the lead-out wirings 130 and 160 are formed.

Subsequently, an insulating layer is formed on the substrate 100, the first electrode 110, and the lead-out wirings 130 and 160, and the insulating layers are selectively removed by etching (for example, dry etching or wet etching) or the like. Thereby, the insulating layer 120, the first opening 122, and the second opening 124 are formed. For example, when the insulating layer 120 is formed of polyimide, heat treatment is performed on the insulating layer 120. Thereby, the imidization of the insulating layer 120 proceeds.

Subsequently, the partition wall 170 is formed on the insulating layer 120, and the partition wall 170 is selectively removed by etching (for example, dry etching or wet etching) or the like. Thereby, the partition wall 170 is formed. When the partition wall 170 is formed of a photosensitive insulating film, the partition wall 170 can have a cross section having an inverted trapezoid shape by adjusting conditions during exposure and developing.

When the partition wall 170 is a negative resist, a portion of the negative resist which is irradiated with light irradiated from an exposure light source is hardened. In addition, an unhardened portion in the negative resist is dissolved and removed by a developer, and thus the partition wall 170 is formed.

Subsequently, the hole injection layer 141, the hole transport layer 142, the light emitting layer 144, the electron transport layer 146, and the electron injection layer are formed within the first opening 122 in this order. At least the hole injection layer 141 among these layers is formed by an coating method such as, for example, spray coating, dispenser coating, ink jet, or printing. In this case, a coating material intrudes into the first opening 122, and the coating material is dried, and thus the above-mentioned layers are formed. As the coating material used in the coating method, a high-molecular material, a low-molecular material mixed in a high-molecular material, and the like are suitably used. Examples of the coating material to be used include a polyalkylthiophene derivative, a polyaniline derivative, triphenylamine, a sol-gel film of an inorganic compound, an organic compound film containing a lewis acid, a conductive polymer, and the like. Meanwhile, the rest of the layers in the organic layer 140 (for example, the electron transport layer 146) are formed by a vapor deposition method. However, the layers may also be formed by any of the above-mentioned coating methods.

Subsequently, the second electrode 150 is formed on the organic layer 140 by, for example, a vapor deposition method or a sputtering method.

Meanwhile, at least one of the layers other than the organic layer 140, for example, the first electrode 110, the insulating layer 120, the lead-out wirings 130, the lead-out wirings 160, the second electrode 150, and the partition wall 170 may be formed by any of the above-mentioned coating methods.

Subsequently, the first layer 212, the second layer 214, and the sealing film 220 are formed by the above-described method.

As described above, also in the present example, the buffer film 210 is formed between the sealing film 220 and the organic EL element 102, and thus adhesiveness of the sealing film 220 and the organic EL element 102 increases. In addition, the buffer film 210 includes the first layer 212 and the second layer 214. It is possible to suppress the transmission of stress generated in the sealing film 220 to the organic EL element 102 by providing the first layer 212. In addition, adhesiveness of the second layer 214 with respect to the sealing film 220 is higher than adhesiveness of the first layer 212 with respect to the sealing film 220 in a case where the first layer 212 comes into direct contact with the sealing film 220. Accordingly, it is possible to increase the adhesiveness of the sealing film 220 with respect to the buffer film 210 by providing the second layer 214.

Example 2

Figure 6:
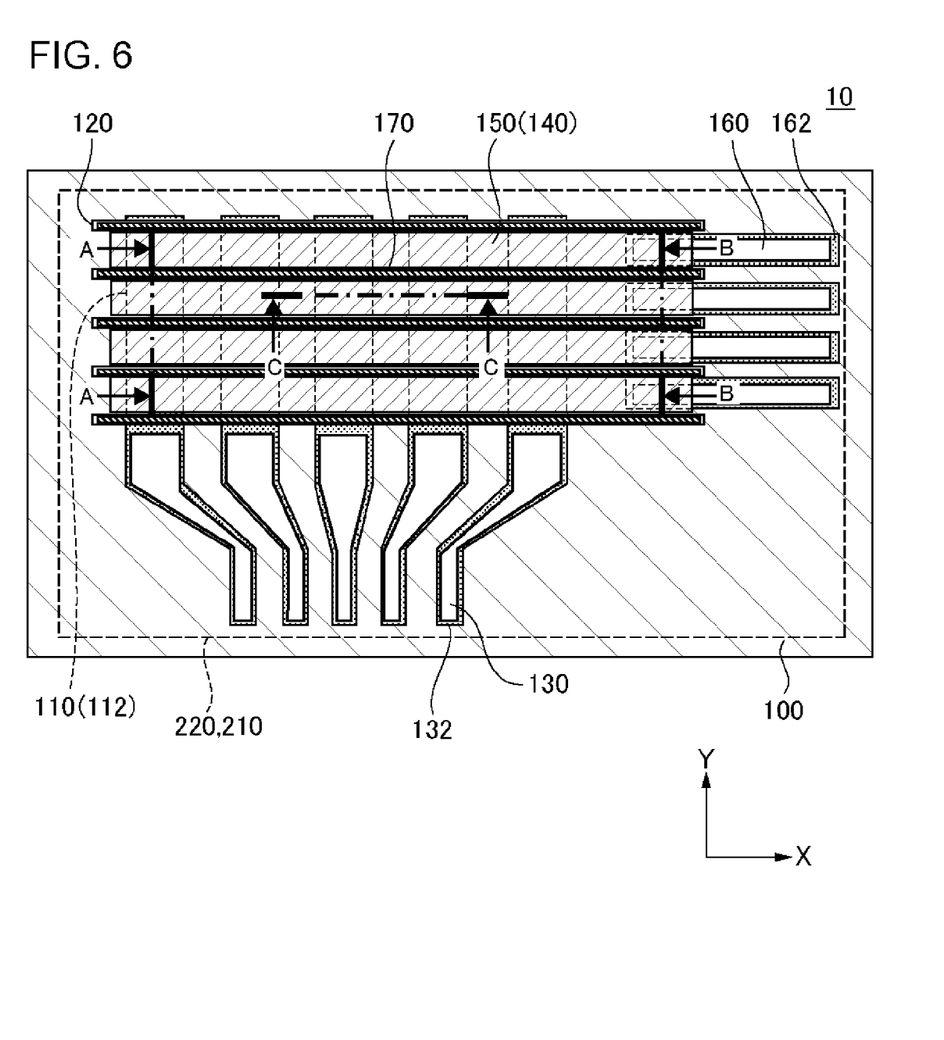
FIG. 6 is a plan view illustrating a configuration of a light emitting device according to Example 2.
Figure 7:
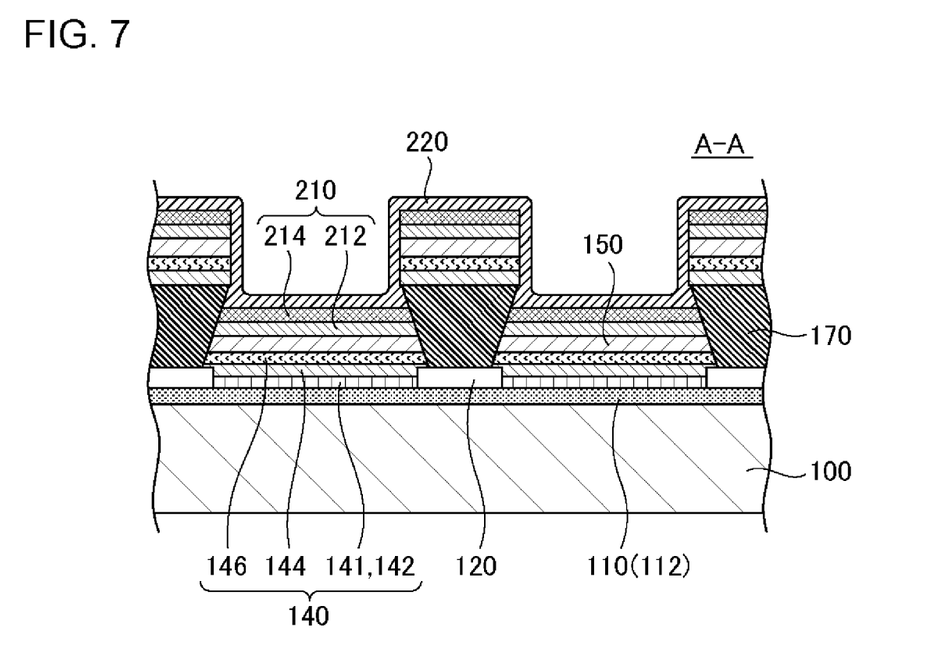
FIG. 7 is a cross-sectional view taken along line A-A of FIG. 6.
Figure 8:
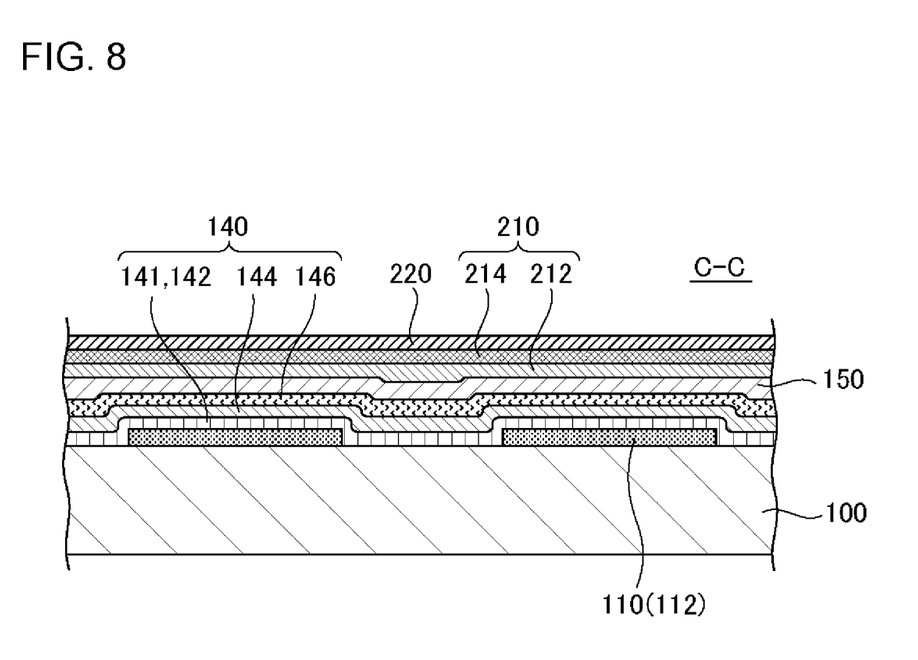
FIG. 8 is a cross-sectional view taken along line C-C of FIG. 6.

FIG. 6 is a plan view illustrating a configuration of a light emitting device 10 according to Example 2. FIG. 7 is a cross-sectional view taken along line A-A of FIG. 6. FIG. 8 is a cross-sectional view taken along line C-C of FIG. 6. The light emitting device 10 according to the present example has the same configuration as that of the light emitting device 10 according to Example 1 except for in the following respect.

First, an insulating layer 120 is provided only under a partition wall 170 and covers the top face of a first electrode 110, but does not cover the lateral side thereof. That is, the lateral side of the first electrode 110 is exposed. For this reason, a non-formation region of the insulating layer 120 in which the insulating layer 120 is not provided is present between the adjacent two first electrodes 110.

In addition, a substrate 100 is a thin plate made of a resin (for example, a resin film). For this reason, the light emitting device 10 has flexibility.

Also in the present example, similar to Example 1, a buffer film 210 is formed between a sealing film 220 and an organic EL element 102, and thus adhesiveness of the sealing film 220 and the organic EL element 102 increases. In addition, the buffer film 210 includes a first layer 212 and a second layer 214, and thus it is possible to suppress the transmission of stress generated in the sealing film 220 to the organic EL element 102 and to increase the adhesiveness of the sealing film 220 with respect to the buffer film 210.

In addition, when the insulating layer 120 is formed of polyimide, moisture or gas remaining in the insulating layer 120 may result in a possibility of an organic layer 140 deteriorating. In order to suppress such a problem, it is generally necessary to increase the heat treatment temperature of the insulating layer 120. However, when the treatment temperature of the insulating layer 120 is increased, it is not possible to use a resin as a material of the substrate 100.

On the other hand, in the present example, the insulating layer 120 is formed only under the partition wall 170. For this reason, a region in which the insulating layer 120 having moisture remaining is formed can be made relatively small. In addition, deterioration in the organic layer 140 may be able to be suppressed by discharging moisture and the like remaining in the insulating layer 120 from the partition wall 170. For this reason, even when heating temperature at the time of imidizing the insulating layer 120 is lowered, it is possible to reduce the amount of moisture or gas coming out of the insulating layer 120 while the light emitting device 10 is being used. For this reason, even when the substrate 100 is formed of a resin, it is possible to prevent the substrate 100 from being damaged in the heat treatment of the insulating layer 120. It is possible to use the substrate 100 made of a resin by lowering the heating temperature of the insulating layer 120, and it is possible to obtain a desired light emitting device 10 by reducing a region in which the insulating layer 120 is formed and forming the insulating layer 120 only under the partition wall 170.

Meanwhile, when adhesiveness of a material used for the partition wall 170 and the substrate 100 is satisfactory, it is also considered that the insulating layer 120 is not provided in the light emitting device 10. When adhesiveness of the material used for the partition wall 170 and the substrate 100 is inferior, it becomes difficult to form the plurality of desired partition walls 170 when the partition wall 170 is formed directly on the substrate 100. Specifically, examples of such a case include a case where the partition wall 170 to be provided is not present in a portion of the region on the substrate 100, a case where the partition wall 170 is not erected with respect to the substrate 100 and is laid down, and the like. In the present example, a plurality of desired partition walls 170 are formed by providing the insulating layer 120 under the partition wall 170.

Example 3

Figure 9:
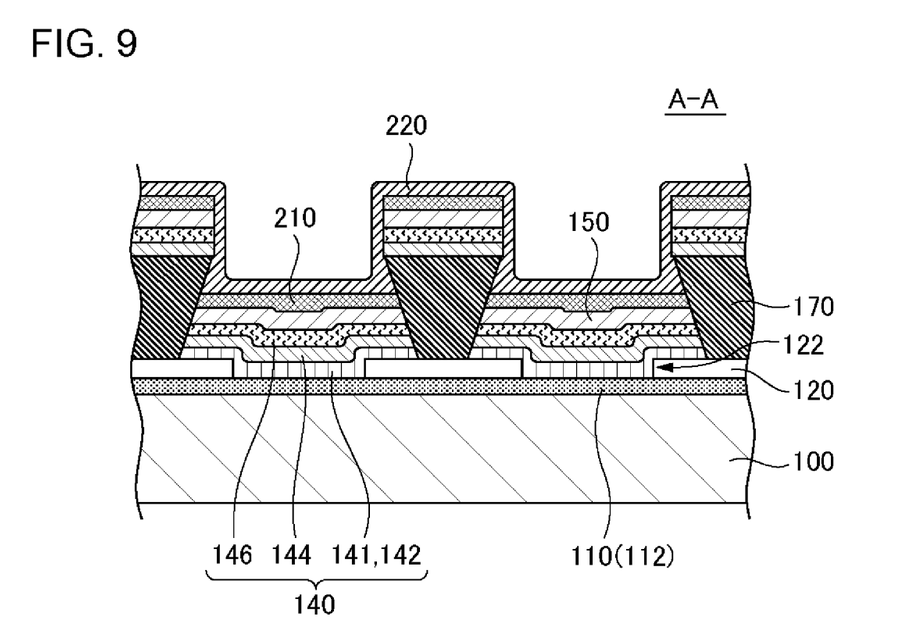
FIG. 9 is a cross-sectional view illustrating a configuration of a light emitting device according to Example 3.
Figure 10:
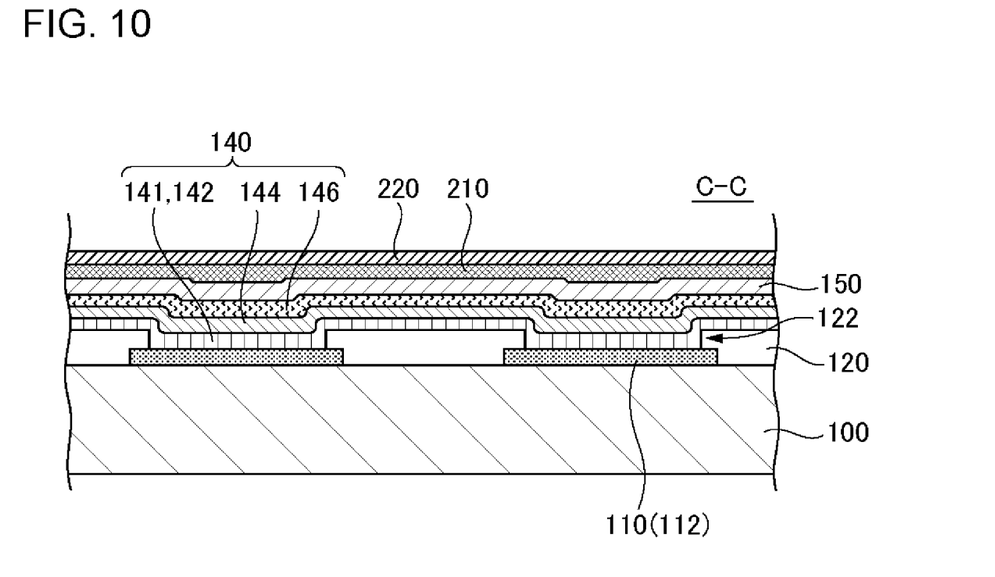
FIG. 10 is a cross-sectional view illustrating a configuration of the light emitting device according to Example 3.

FIGS. 9 and 10 are cross-sectional views illustrating a configuration of a light emitting device 10 according to Example 3. FIG. 9 corresponds to FIG. 3 of Example 1, and FIG. 10 corresponds to FIG. 4 of Example 1. The light emitting device 10 according to Example 3 has the same configuration as that of the light emitting device 10 according to Example 1 or Example 2 except that a buffer film 210 is configured as a single layer.

Also in the present example, the buffer film 210 is formed between a sealing film 220 and an organic EL element 102, and thus adhesiveness of the sealing film 220 and the organic EL element 102 increases.

Example 4

Figure 11:
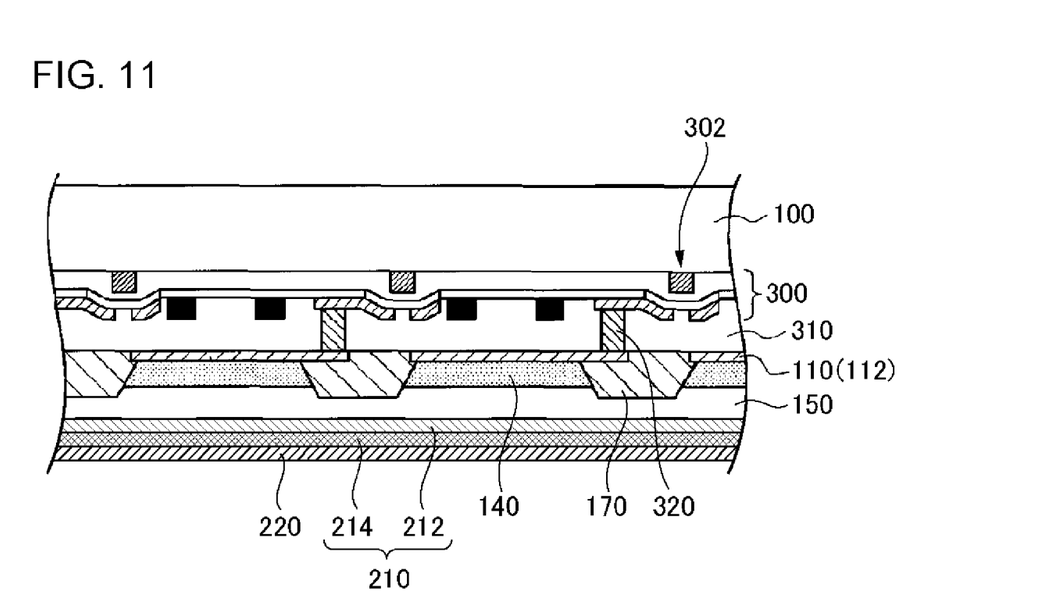
FIG. 11 is a cross-sectional view illustrating a configuration of a light emitting device according to Example 4.

FIG. 11 is a cross-sectional view illustrating a configuration of a light emitting device 10 according to Example 4. The light emitting device 10 illustrated in the present drawing is an active type display.

In detail, a transistor formation layer 300 and an insulating layer 310 are provided between a substrate 100 and a first electrode 110, a semiconductor layer (for example, a silicon layer) is formed in the transistor formation layer 300, and a plurality of thin film transistors (TFTs) 302 are formed using the semiconductor layer. In addition, the insulating layer 310 is formed between the transistor formation layer 300 and the first electrode 110. The insulating layer 310 also functions as a planarization layer.

In the present example, the first electrode 110 is formed in pixel units. In addition, the first electrode 110 is connected to TFTs 302, different from each other, through a conductor 320 buried in the insulating layer 310. On the other hand, a second electrode 150 is a common electrode, and thus is also formed on a region between the pixels and on a partition wall 170.

In addition, also in the present example, a first layer 212, a second layer 214, and a sealing film 220 are formed on the second electrode 150. Meanwhile, the first layer 212 may not be formed.

Also, in the present example, a buffer film 210 is formed between the sealing film 220 and an organic EL element 102, and thus adhesiveness of the sealing film 220 and the organic EL element 102 increases. In addition, the buffer film 210 includes the first layer 212 and the second layer 214, and thus it is possible to suppress the transmission of stress generated in the sealing film 220 to the organic EL element 102 and to increase the adhesiveness of the sealing film 220 with respect to the buffer film 210.

The embodiment and the examples have been described so far with reference to the accompanying drawings, but are merely illustrative of the present invention, and various configurations other than the above-mentioned configurations can also be adopted.

The invention claimed is:

1. A light emitting device comprising:
a substrate;
an organic EL element which is formed over the substrate;
a sealing film which is formed over the organic EL element; and
a buffer film which is located between the organic EL element and the sealing film,
wherein the buffer film comes into close contact with the sealing film, and the sealing film includes a plurality of layers, each of which is formed of an oxide,
wherein the organic EL element includes an upper electrode on a side opposite to the substrate,
wherein the buffer film includes a first layer coming into contact with the upper electrode and a second layer coming into contact with the sealing film, and
wherein adhesive force between the sealing film and the second layer is higher than adhesive force between the upper electrode and the first layer.

2. A light emitting device comprising:
a substrate;
an organic EL element which is formed over the substrate;
a sealing film which is formed over the organic EL element; and
a buffer film which is located between the organic EL element and the sealing film,
wherein the buffer film comes into close contact with the sealing film, and the sealing film includes a plurality of layers, each of which is formed of an oxide,
wherein the organic EL element includes an upper electrode on a side opposite to the substrate,
wherein the buffer film includes at least a first layer coming into contact with the upper electrode and a second layer coming into contact with the sealing film, and
wherein adhesive force between the sealing film and the second layer is higher than adhesive force between the first layer and the upper electrode and is higher than adhesive force between the sealing film and the first layer in a case where the first layer comes into contact with the sealing film.

3. The light emitting device according to claim 1,
wherein the organic EL element includes an upper electrode on a side opposite to the substrate, and
wherein adhesive force between the buffer film and the sealing film is higher than adhesive force between the sealing film and the upper electrode in a case where the sealing film comes into contact with the upper electrode.

4. The light emitting device according to claim 1, wherein the buffer film adheres to the sealing film.

5. The light emitting device according to claim 1, wherein the thickness of the sealing film is equal to or greater than 10 nm and equal to or less than 30 nm.

* * * * *